United States Patent
Heo et al.

(10) Patent No.: US 9,064,777 B2
(45) Date of Patent: Jun. 23, 2015

(54) GRAPHENE SWITCHING DEVICE HAVING TUNABLE BARRIER

(75) Inventors: Jin-Seong Heo, Seoul (KR); Hyun-jong Chung, Hwaseong-si (KR); Hyun-jae Song, Hwaseong-si (KR); Seong-jun Park, Seoul (KR); David Seo, Yongin-si (KR); Hee-jun Yang, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 13/591,732

(22) Filed: Aug. 22, 2012

(65) Prior Publication Data
US 2013/0048951 A1  Feb. 28, 2013

(30) Foreign Application Priority Data
Aug. 26, 2011  (KR) .................. 10-2011-0085820

(51) Int. Cl.
| | |
|---|---|
| H01L 29/49 | (2006.01) |
| H01L 29/16 | (2006.01) |
| H01L 29/786 | (2006.01) |
| B82Y 10/00 | (2011.01) |
| H01L 29/417 | (2006.01) |
| H01L 29/778 | (2006.01) |
| H01L 29/08 | (2006.01) |
| H01L 29/165 | (2006.01) |

(52) U.S. Cl.
CPC ...... *H01L 29/1606* (2013.01); *H01L 29/78684* (2013.01); *B82Y 10/00* (2013.01); *H01L 29/41725* (2013.01); *H01L 29/778* (2013.01); *H01L 29/7781* (2013.01); *H01L 29/0895* (2013.01); *H01L 29/165* (2013.01)

(58) Field of Classification Search
USPC ................ 257/20, 24, 30; 977/720, 721, 734
See application file for complete search history.

(56) References Cited

U.S. PATENT DOCUMENTS

| | | | | | |
|---|---|---|---|---|---|
| 3,603,731 | A | * | 9/1971 | Weimer | 348/310 |
| 4,721,983 | A | * | 1/1988 | Frazier | 257/24 |
| 4,894,526 | A | * | 1/1990 | Bethea et al. | 250/214.1 |
| 6,306,691 | B1 | * | 10/2001 | Koh | 438/149 |
| 8,274,098 | B2 | * | 9/2012 | Chung et al. | 257/192 |
| 2003/0209739 | A1 | * | 11/2003 | Hisamoto et al. | 257/278 |
| 2008/0312088 | A1 | * | 12/2008 | Chung et al. | 505/193 |
| 2010/0258787 | A1 | | 10/2010 | Chae et al. | |
| 2012/0032227 | A1 | * | 2/2012 | Seabaugh et al. | 257/105 |
| 2012/0223390 | A1 | * | 9/2012 | Liang et al. | 257/369 |
| 2012/0280208 | A1 | * | 11/2012 | Jain | 257/20 |
| 2012/0292596 | A1 | * | 11/2012 | Dabrowski et al. | 257/29 |
| 2013/0037780 | A1 | * | 2/2013 | Kivioja et al. | 257/26 |
| 2013/0082241 | A1 | * | 4/2013 | Kub et al. | 257/21 |
| 2013/0134391 | A1 | * | 5/2013 | Afzali-Ardakani et al. | 257/29 |
| 2013/0168641 | A1 | * | 7/2013 | Rezeq | 257/39 |

* cited by examiner

*Primary Examiner* — Michael Shingleton
(74) *Attorney, Agent, or Firm* — Harness, Dickey & Pierce, PLC

(57) ABSTRACT

According to example embodiments, a graphene switching devices has a tunable barrier. The graphene switching device may include a gate substrate, a gate dielectric on the gate substrate, a graphene layer on the gate dielectric, a semiconductor layer and a first electrode sequentially stacked on a first region of the graphene layer, and a second electrode on a second region of the graphene layer. The semiconductor layer may be doped with one of an n-type impurity and a p-type impurity. The semiconductor layer may face the gate substrate with the graphene layer being between the semiconductor layer and the gate substrate. The second region of the graphene layer may be separated from the first region on the graphene layer.

23 Claims, 5 Drawing Sheets

GRAPHENE SWITCHING DEVICE HAVING TUNABLE BARRIER

CROSS-REFERENCE TO RELATED APPLICATIONS

This application claims priority under 35 U.S.C. §119 to Korean Patent Application No. 10-2011-0085820, filed on Aug. 26, 2011, in the Korean Intellectual Property Office, the disclosure of which is incorporated herein in its entirety by reference.

BACKGROUND

1. Field

Example embodiments relate to graphene switching devices that have a tunable semiconductor barrier.

2. Description of the Related Art

Graphene, which has a 2-dimensional hexagonal carbon structure, is a material that may replace semiconductors, and thus, recently worldwide studies about graphene have been actively conducted. Graphene may be a zero gap semiconductor. When a graphene nano-ribbon (GNR) having a graphene channel width of 10 nm or less is formed, a band gap is formed by a size effect. Accordingly, a field effect transistor that may operate at room temperature may be manufactured by using the GNR.

When a graphene transistor using a GNR as a channel is manufactured, an on/off ratio of the graphene transistor may increase. However, the mobility at the GNR may be reduced and on-current of the graphene transistor may be small due to disordered edges of the GNR. As a method of relieving the drawback of the GNR, a band gap may be formed by applying an electric field to a bi-layered graphene in a perpendicular direction. However, this method is a large size CVD method and thus it may be difficult to grow uniform bilayered graphene and to be commercialized due to a random domain.

SUMMARY

Example embodiments relate to graphene switching devices that have a tunable semiconductor barrier.

Additional aspects will be set forth in part in the description which follows and, in part, will be apparent from the description, or may be learned by practice of example embodiments.

According to example embodiments, a graphene switching device having a tunable barrier includes: a gate substrate; a gate dielectric on the gate substrate; a graphene layer on the gate dielectric; a semiconductor layer and a first electrode sequentially stacked on a first region of the graphene layer, the semiconductor layer being doped with one of an n-type impurity and a p-type impurity, and the semiconductor layer facing the gate substrate with the graphene layer being between the semiconductor layer and the gate substrate; and a second electrode on a second region of the graphene layer, the second region being separated from the first region of the graphene layer.

The semiconductor layer may include one of silicon, germanium, silicon-germanium, a group III-V semiconductor, and a group II-VI semiconductor.

The graphene layer may be separated from the first electrode.

The semiconductor layer may have a thickness in a range of about 1 nm to about 10 nm.

The first and second electrodes may contain one of metal and polysilicon.

The graphene switching device may be a uni-polar transistor having a polarity that is the same as an impurity type of the semiconductor layer.

The semiconductor layer may be configured to form an energy gap between the graphene layer and the first electrode, and the energy gap may change according to a gate voltage applied to the gate substrate.

A portion of the graphene layer may include one to four layers of graphene.

According to example embodiments, a graphene switching device having a tunable barrier includes: a semiconductor layer configured to form an energy gap between a graphene layer and a first electrode, the first electrode being on a first region of the semiconductor layer, the graphene layer being on the semiconductor layer; an insulating layer on a second region of the semiconductor layer, the insulating layer being separated from the first electrode, the graphene layer being between the first electrode and the insulating layer, the graphene layer extending onto the insulating layer; a second electrode on the graphene layer and the second region of the semiconductor layer, the second electrode facing the insulating layer; a gate dielectric on the graphene layer; and a gate electrode on the gate dielectric.

The semiconductor layer may include one of silicon, germanium, silicon-germanium, a group III-V semiconductor, and a group II-VI semiconductor.

The graphene layer may be separated from the first electrode.

A gap between the graphene layer and the first electrode may be in a range from about 1 nm to about 30 nm.

The first and second electrodes may contain one of metal and polysilicon.

The graphene switching device may be a uni-polar transistor having a polarity that is the same as an impurity type of the semiconductor layer.

The energy gap formed by the semiconductor layer may change according to a gate voltage applied to the gate electrode.

At least a portion of the graphene layer may have one to four layers of graphene.

According to example embodiments, a graphene switching device having a tunable barrier includes: a graphene layer including a first surface opposite a second surface; a semiconductor layer containing one of an n-type impurity and a p-type impurity, the semiconductor layer contacting one of a first part of the first surface of the graphene layer and a first part of the second surface of the graphene layer; a first electrode contacting the semiconductor layer, the first electrode being separated from the graphene layer; a second electrode contacting a second part of the first surface of the graphene layer; a gate electrode; and a gate dielectric contacting the gate electrode and the graphene layer, the gate dielectric being between the gate electrode and the semiconductor layer.

The semiconductor layer may include one of silicon, germanium, silicon-germanium, a group III-V semiconductor, and a group II-VI semiconductor.

At least one of the first and second electrodes may contain one of a metal and polysilicon.

At least a portion of the graphene layer may have a thickness of one to four layers of graphene.

The graphene switching device may be a uni-polar transistor having a polarity that is the same as an impurity type of the semiconductor layer.

The semiconductor layer may be configured to form an energy gap between the graphene layer and the first electrode, and the energy gap may change according to a gate voltage applied to the gate substrate.

The gate dielectric may be on the gate electrode. The graphene layer may be on the gate dielectric. The semiconductor layer may be on the graphene layer and may contact the first part of the first surface of the graphene layer. The first electrode may be on the semiconductor layer. The second electrode may be spaced apart from the semiconductor layer on the first surface of the graphene layer.

The semiconductor layer may have a thickness in a range of about 1 nm to about 10 nm.

The semiconductor layer may contact the first part of the second surface of the graphene layer. The graphene layer may be on the semiconductor layer. The first electrode may be on the semiconductor layer. The gate dielectric may be on the graphene layer. The gate electrode may be on the gate dielectric.

A gap between the graphene layer and the first electrode along a surface of the semiconductor layer may be in a range from about 1 nm to about 30 nm.

The gate dielectric may fill the gap separating the first electrode and the graphene layer.

An insulating layer may be between a second part of the second surface of the graphene layer and the semiconductor layer, and the graphene layer may extend between the insulating layer and the second electrode.

The graphene layer may be configured to function as a pathway for one of electrons and holes flowing through the graphene layer when a gate voltage is applied to the gate electrode.

The graphene switching device may be operated as a diode by adjusting a current flowing through the graphene layer. Adjusting the current may include at least one of applying a forward bias between the first and second electrodes to increase the current flowing through the graphene layer, and applying a negative bias between the first and second electrodes to decrease the current flowing through the graphene layer.

The graphene switching device may be operated as a triode by applying a forward bias between the first and second electrodes, and adjusting a gate voltage applied to the gate electrode in order to tune an energy gap between the semiconductor layer and the graphene layer. Increasing a magnitude of the gate voltage applied to the gate electrode may reduce the energy gap between the semiconductor layer and the graphene layer. Decreasing a magnitude of the gate voltage applied to the gate electrode may increase the energy gap between the semiconductor layer and the graphene layer.

The graphene switching device may be operated as a transistor by applying a negative bias between the first and second electrodes, and adjusting a gate voltage applied to the gate electrode in order to tune a saturation current level of the graphene switching device.

BRIEF DESCRIPTION OF THE DRAWINGS

These and/or other aspects will become apparent and more readily appreciated from the following description of non-limiting embodiments, as illustrated in the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
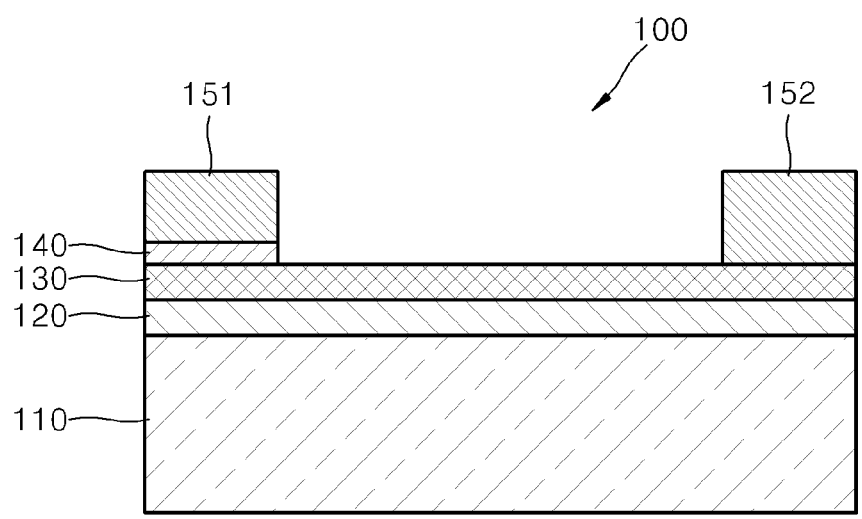
FIG. 1 is a schematic cross-sectional view of a graphene switching device including a tunable barrier according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a graphene switching device 100 including a tunable barrier according to example embodiments.

Referring to FIG. 1, a gate dielectric 120 is formed on a substrate 110. A graphene layer 130 is formed on the gate dielectric 120. A semiconductor layer 140 is formed on a first region of the graphene layer 130 and a first electrode 151 is formed on the semiconductor layer 140. A second electrode 152 is formed on a second region of the graphene layer 130 separated from the first region.

The first electrode 151 may be one of a source electrode and a drain electrode and the second electrode 152 may be the other one of a source electrode and a drain electrode. The first electrode 151 and the second electrode 152 may be formed of a metal or polysilicon.

The substrate 110 may function as a back gate (e.g., gate electrode) and may be formed of a semiconductor doped with an impurity or a metal.

The gate dielectric 120 may be formed of silicon oxide or silicon nitride, but example embodiments are not limited thereto.

The graphene layer 130 may be formed by transferring graphene that is manufactured by a chemical vapor deposition (CVD) method and patterning the transferred graphene. The graphene layer 130 may include a single layer to four layers of graphene. The graphene layer 130 may be a moving path of carriers and may have a zero band gap, and/or a band gap that is less than 30 meV.

The semiconductor layer 140 may include one of silicon, germanium, silicon-germanium, a group III-V semiconductor, and a group II-VI semiconductor. The semiconductor layer 140 may be formed to have a thickness for tunneling of carriers. Although the thickness of the semiconductor layer 140 may vary according to materials used, the semiconductor layer 140 may have a thickness in a range from about 1 nm to about 10 nm. The semiconductor layer 140 may be doped with either a p-type impurity or an n-type impurity. As shown in FIG. 1, the semiconductor layer 140 is disposed to face a gate electrode (the back gate substrate 110) with the graphene layer 130 interposed therebetween. An energy gap of the semiconductor layer 140 may be controlled by a gate voltage. Accordingly, the semiconductor layer 140 is a tunable barrier, and may be referred to as a semiconductor barrier.

The graphene switching device 100 that has a tunable barrier may be a uni-polar transistor that becomes an n-type transistor or a p-type transistor according to a polarity of the semiconductor layer 140. That is, if the semiconductor layer 140 is doped with an n-type impurity, the graphene switching device 100 that has a tunable barrier is an n-type transistor. Otherwise, if the semiconductor layer 140 is doped with a p-type impurity, the graphene switching device 100 that has a tunable barrier is a p-type transistor. Thus, the graphene layer 130 may be electrostatically doped according to a gate voltage applied to the substrate 110.

FIGS. 2A through 2D are energy band diagrams for explaining an operation of the graphene switching device 100 of FIG. 1, according to example embodiments.

Figure 2A:
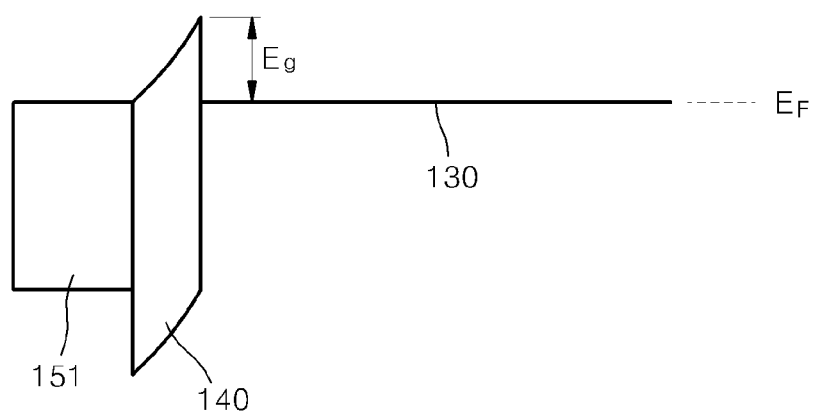
FIGS. 2A through 2D are energy band diagrams for explaining an operation of the graphene switching device of FIG. 1, according to example embodiments.
Figure 2B:
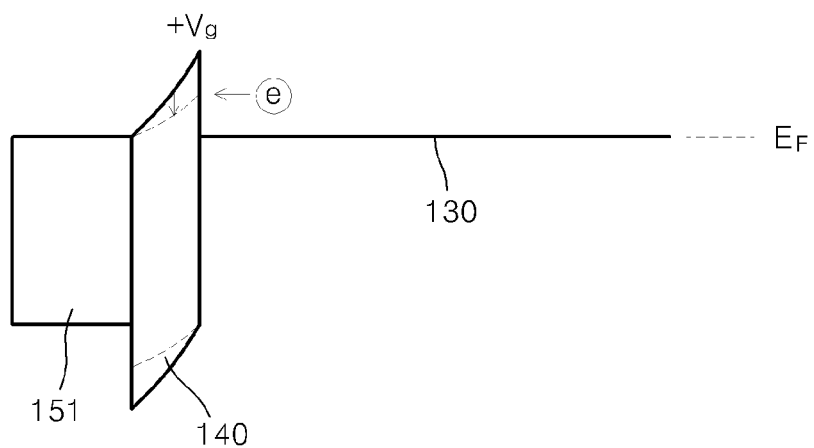

FIGS. 2A and 2B are energy band diagrams for explaining an operation of an n-type graphene switching device 100. FIG. 2A shows a state before applying a gate voltage and FIG. 2B shows a state when a gate voltage is applied.

Referring to FIG. 2A, in a state that a gate voltage is not applied to the substrate 110 which is a gate electrode, an energy band structure corresponding to respective work functions of the graphene layer 130 and the first electrode 151 are respectively formed on both sides of the semiconductor layer 140. Because the graphene switching device 100 includes an n-type semiconductor layer 140, main carriers are electrons. The semiconductor layer 140 between the first electrode 151 and the graphene layer 130 is an energy barrier therebetween. According to example embodiments, the semiconductor layer 140 is also referred to as a semiconductor barrier. The mobilization of the carriers is restricted by an energy gap Eg between the graphene layer 130 and the semiconductor layer 140. In FIGS. 2A and 2B, $E_F$ indicates a Fermi energy level of the graphene layer 130.

Referring to FIG. 2B, in a state when a desired (and/or alternatively predetermined) voltage is applied to the first electrode 151 and the second electrode 152, when a desired (and/or alternatively predetermined) positive gate voltage +Vg is applied to the substrate 110 which is a back gate, the energy gap Eg of the semiconductor layer 140 is reduced as indicated by a dashed line. Accordingly, electrons are readily moved from the graphene layer 130 to the first electrode 151. A current may flow in the graphene switching device 100 due to the gate voltage, and thus, the graphene switching device 100 functions as a field effect transistor. The graphene layer 130 is a pathway of the carriers, and this is distinguished from a channel of a conventional field effect transistor.

Due to the reduction of the energy gap Eg, electrons may move through the semiconductor layer 140 due to the tunneling effect of the semiconductor layer 140.

As the gate voltage increases, the energy gap Eg of the semiconductor layer 140 is further reduced. Accordingly, the energy gap Eg of the semiconductor layer 140 is controllable.

Figure 3:
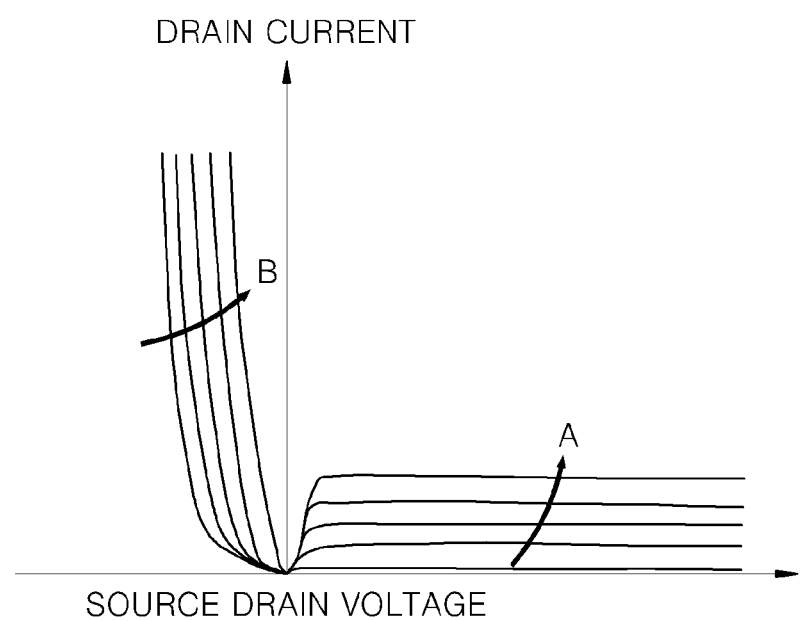
FIG. 3 is an I-V characteristic curve of an n-type graphene switching device according to example embodiments.

FIG. 3 is an I-V characteristic curve of an n-type graphene switching device according to example embodiments.

Referring to FIG. 3, when a source-drain voltage is a positive voltage, a drain current increases in a direction indicated by an arrow A while the energy gap may be reduced as the gate voltage increases.

In FIGS. 2A and 2B, when a negative voltage is applied to the first electrode 151 of the graphene switching device 100 that includes an n-type semiconductor layer 140, electrons flow well without an energy barrier. However, when a positive voltage is applied to the first electrode 151, a current may not flow well due to an energy barrier. Accordingly, the graphene switching device 100 may function as a diode. At this time, since the magnitude of the energy barrier is controlled due to the increase in the gate voltage, the current increases in a direction indicated by an arrow B, and thus, the diode characteristic of the graphene switching device 100 may be controlled.

Figure 2C:
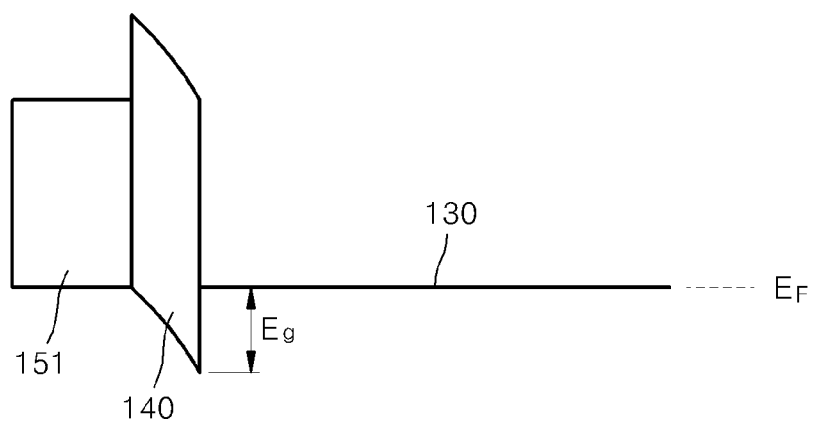
Figure 2D:
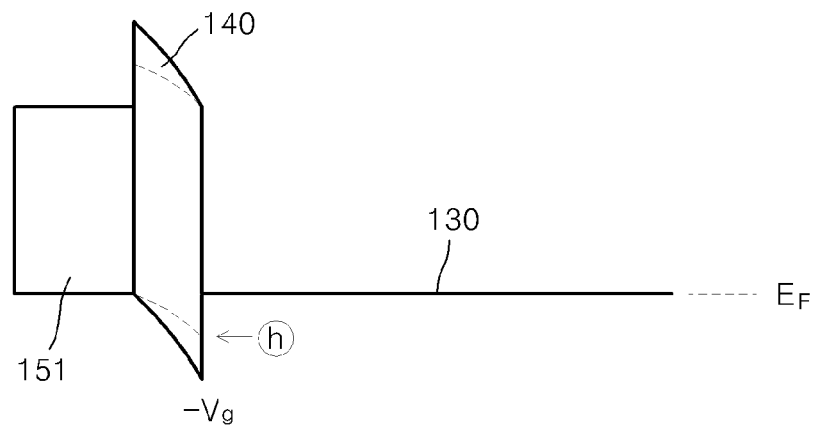

FIGS. 2C and 2D are energy band diagrams for explaining an operation of a p-type graphene switching device 100. FIG. 2C shows a state before applying a gate voltage and FIG. 2D shows a state when a gate voltage is applied.

Referring to FIG. 2C, in a state when a gate voltage is not applied to the substrate 110 which is a gate electrode, an energy band structure corresponding to work functions of the graphene layer 130 and the first electrode 151 are respectively formed on both sides of the semiconductor layer 140. Because the graphene switching device 100 includes a p-type semiconductor layer 140, main carriers are holes. The semiconductor layer 140 between the first electrode 151 and the graphene layer 130 is an energy barrier therebetween. The mobilization of the carriers is restricted by an energy gap Eg between the graphene layer 130 and the semiconductor layer 140. In FIGS. 2C and 2D, $E_F$ indicates a Fermi energy level of the graphene layer 130.

Referring to FIG. 2D, in a state when a desired (and/or alternatively predetermined) voltage is applied to the first electrode 151 and the second electrode 152, when a desired (and/or alternatively predetermined) negative gate voltage −Vg is applied to the substrate 110 which is a back gate, an energy gap Eg of the semiconductor layer 140 is reduced as indicated by dashed lines. Accordingly, holes are readily moved from the graphene layer 130 to the first electrode 151. This denotes that a current flows in the graphene switching device 100 due to the gate voltage, and thus, the graphene switching device 100 functions as a field effect transistor.

Due to the reduction of the energy gap Eg, holes may move through the semiconductor layer 140 due to the tunneling effect of the semiconductor layer 140.

As a magnitude of the gate voltage increases, the energy gap Eg of the semiconductor layer 140 is further reduced. Accordingly, the energy gap Eg of the semiconductor layer 140 is controllable.

Figure 4:
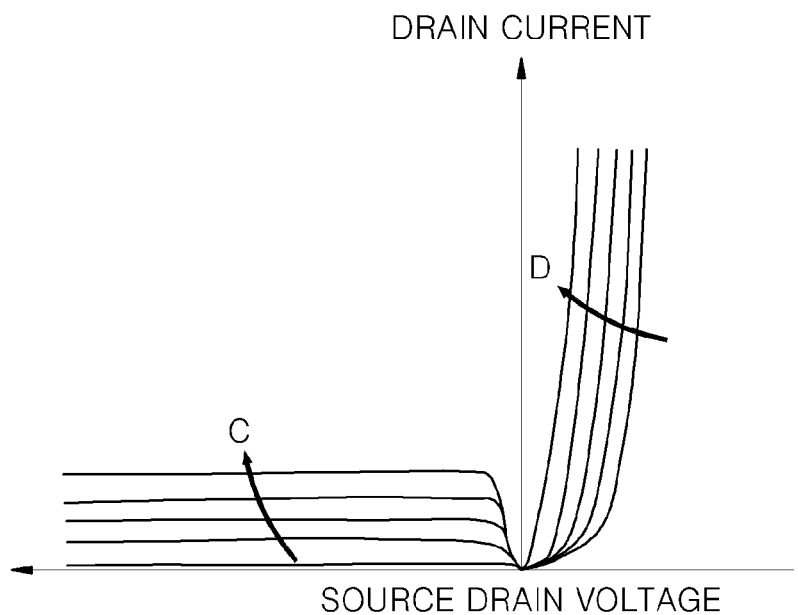
FIG. 4 is an I-V characteristic curve of a p-type graphene switching device according to example embodiments.

FIG. 4 is an I-V characteristic curve of a p-type graphene switching device according to example embodiments.

Referring to FIG. 4, when a source-drain voltage is a negative voltage, as an absolute value of the negative gate voltage increases, the energy gap decreases so that a drain current increases in a direction indicated by an arrow C.

In FIGS. 2C and 2D, when a positive voltage is applied to the first electrode 151 of the graphene switching device 100 that includes a p-type semiconductor layer 140, holes flow well over an energy barrier. However, when a negative voltage is applied to the first electrode 151, holes may not flow well due to an energy barrier. Accordingly, the graphene switching device 100 functions as a diode. Also, at this point, since the magnitude of the energy barrier is controlled at a low level due to the increase in an absolute value of the negative gate voltage, the holes increase in a direction indicated by an arrow D, and thus, the diode characteristic of the graphene switching device 100 may be controlled.

In a field effect transistor that uses a conventional graphene channel, in order to form a band gap in a graphene layer, a graphene nano ribbon channel may be formed by patterning graphene. However, in the patterning process, the graphene channel may be damaged. However, in the graphene switching device 100 that has a tunable barrier according to example embodiments, an energy gap may be formed between the first electrode 151 and the graphene layer 130 by disposing the semiconductor layer 140 between the first electrode 151 and the graphene layer 130. Also, since the graphene layer 130 merely functions as a carrier pathway, a field effect transistor may be realized by using the graphene layer 130. Also, since there is no practical limit to the width of graphene, the reduction of yield in a process of forming a graphene nano ribbon channel may be reduced (and/or avoided).

Referring to FIGS. 1, 3, and 4, a graphene switching device 100 according to example embodiments may also be operated as a triode and/or a transistor.

For triode operation, a forward bias (left part in FIG. 3, or right part in FIG. 4) may be applied between the first electrode 151 and the second electrode 152 (or a negative voltage may be applied to the first electrode 151 and the second electrode 152 may be grounded for an n-type graphene switching device 100, or a positive voltage may be applied to the first electrode 151 and the second electrode 152 may be grounded for a p-type graphene switching device 100), and a gate voltage may be applied to the substrate 110 in order to tune the diode turn-on voltage. The turn-on voltage may be increased when a negative gate voltage is applied to the substrate 110 for an n-type graphene switching device 100 or a positive voltage is applied to the substrate 110 for a p-type graphene switching device 100. The turn-on voltage may be decreased when a positive gate voltage is applied to the substrate 110 for an n-type graphene switching device 100 or a negative voltage is applied to the substrate 110 for a p-type graphene switching device 100.

For transistor operation, reverse bias (right part in FIG. 3 and left part in FIG. 4) may be applied between the first electrode 151 and the second electrode 152 (or a positive voltage may be applied to the first electrode 151 and the second electrode 152 may be grounded for an n-type graphene switching device 100, or a negative voltage may be applied to the first electrode 151 and the second electrode 152 may be grounded for a p-type graphene switching device 100), and a gate voltage may be applied to the substrate 110 in order to turn the saturation current level. In transistor operation, the saturation current level may be increased when a positive gate voltage is applied to the substrate 110 for an n-type graphene switching device 100 or a negative gate voltage is applied to the substrate 110 for a p-type graphene switching device 100. The saturation current level may be decreased when the gate voltage is switched (a negative gate voltage is applied to the substrate 110 for an n-type graphene switching device 100 or a positive gate voltage is applied to the substrate 110 for a p-type graphene switching device 100). Therefore, by applying a gate voltage, a device current may be modulated to make the graphene switching device 100 according to example embodiments operate as a transistor.

Figure 5:
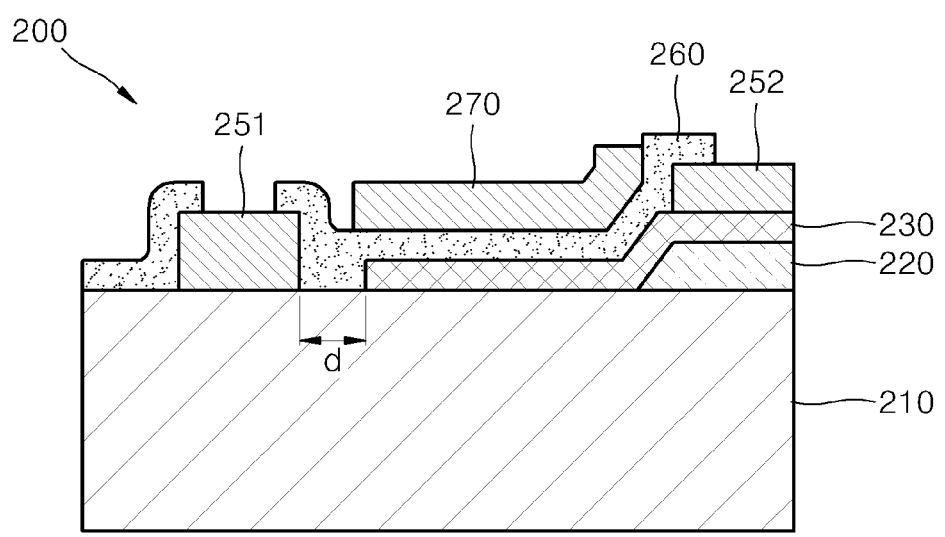
FIG. 5 is a schematic cross-sectional view of a graphene switching device including a tunable barrier according to example embodiments.

FIG. 5 is a schematic cross-sectional view of a graphene switching device 200 including a tunable barrier, according to example embodiments.

Referring to FIG. 5, a first electrode 251 is disposed on a first region of a substrate 210, and an insulating layer 220 is formed on a second region of the substrate 210 separated from the first region. A graphene layer 230 is formed on the substrate 210 and the insulating layer 220. The graphene layer 230 is separated from the first electrode 251 and between the first region and second region to extend onto the insulating layer 220. A separation distance d between the graphene layer 230 and the first electrode 251 may be in a range from about 1 nm to about 30 nm. A second electrode 252 facing the insulating layer 220 is formed on the second region with the graphene layer 230 interposed therebetween. A gate dielectric 260 that covers a portion of the graphene layer 230 is formed on the substrate 210. A gate electrode 270 is formed on the gate dielectric 260.

The first electrode 251 and the second electrode 252 respectively may be a source electrode and a drain electrode or vice versa. The first electrode 251 and the second electrode 252 may be formed of a metal or polysilicon.

The substrate 210 may be a semiconductor substrate (hereinafter, the substrate 210 is referred to as the semiconductor substrate 210). The semiconductor substrate 210 corresponds to the semiconductor layer 140 of the graphene switching device 100 described above. The semiconductor substrate 210 may be formed of one of silicon, germanium, silicon-germanium, a group III-V semiconductor, and a group II-VI semiconductor. The semiconductor substrate 210 may be doped with either a p-type impurity or an n-type impurity. As depicted in FIG. 5, the semiconductor substrate 210 is disposed to face the gate electrode 270 with the graphene layer 230 therebetween. Accordingly, an energy band of the semiconductor substrate 210 may be affected by a gate voltage.

The gate dielectric 260 may be formed of silicon oxide or silicon nitride, but example embodiments are not limited thereto.

The graphene layer 230 may be formed by transferring graphene that is formed by a chemical vapor deposition (CVD) method and patterning the transferred graphene. The graphene layer 230 may include a single layer to four layers of graphene. The graphene layer 230 may be a moving path of carriers and may have a zero band gap, and/or a band gap that is less than 30 meV.

When forming a junction between the graphene layer 230 and the semiconductor substrate 210, a portion of the semiconductor substrate 210 may be exposed before depositing the graphene layer 230 on top of the semiconductor substrate 210. If starting with an insulator on the semiconductor substrate 210, a portion of the insulator in the junction area may be etched to expose an underlying portion of the semiconductor substrate 210. Then, graphene may be directly deposited on the exposed portion of the semiconductor substrate 210.

The graphene switching device 200 that has a tunable barrier may be a uni-polar transistor that may be an n-type transistor or a p-type transistor according to a polarity of the semiconductor substrate 210 which is a semiconductor barrier. That is, if the semiconductor substrate 210 is doped with an n-type impurity, the graphene switching device 200 is an n-type transistor, and if the semiconductor substrate 210 is doped with a p-type impurity, the graphene switching device 200 is a p-type transistor.

The operation of the graphene switching device 200 including a tunable barrier according to example embodiments is the same (and/or substantially the same) as the operation of the graphene switching device 100 including a tunable barrier of FIG. 1, and thus, detailed description thereof will not be repeated.

In the graphene switching device 200 that includes the semiconductor substrate 210, a polarity of a voltage that is in a forward direction is determined according to a doping polarity of the semiconductor substrate 210. Accordingly, the graphene switching device 200 may function as a diode. At this point, since the magnitude of an energy barrier is controlled by a gate voltage, the diode characteristic of the graphene switching device 200 may be controlled.

In a graphene switching device having a tunable barrier according to example embodiments, an energy gap is formed between an electrode and a graphene current path using a semiconductor barrier. Therefore, a channel width of the graphene switching device is not restricted like in a graphene nano ribbon, and thus, graphene defect in a graphene patterning process may be reduced (and/or prevented).

Figure 6:
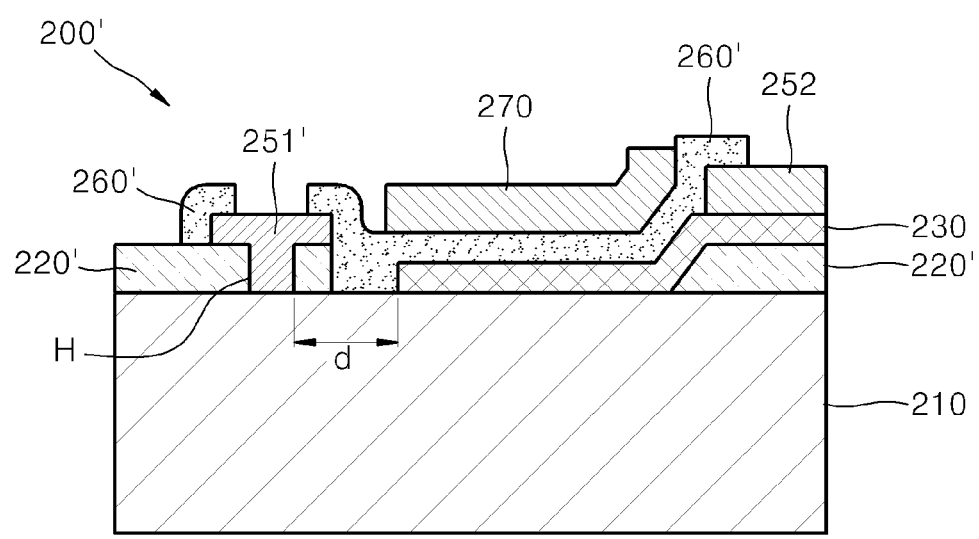
FIG. 6 is a schematic cross-sectional view of a graphene switching device including a tunable barrier according to example embodiments.

FIG. 6 is a schematic cross-sectional view of a graphene switching device 200' 200' including a tunable barrier according to example embodiments.

Referring to FIG. 6, the graphene switching device 200' may be similar to the graphene switching device 200 described above with reference to FIG. 5, except for the structure of the first electrode 251', gate dielectric 260', and the insulating layer 220'.

In FIG. 6, a portion of the insulating layer 220' is between the first electrode 251' and the substrate 210. The portion of the insulating layer 220' defines a hole H. The first electrode 251' extends through the hole H to contact the substrate 210. Additionally, a part of the gate dielectric 260' that is adjacent to the first electrode 251' may be formed on the part of the insulating layer 220' that is adjacent to the first electrode 251'. The materials of the insulating layer 220', first electrode 251', and gate dielectric 260' may be the same as the materials for the insulating layer 220, first electrode 251, and gate dielectric 260 respectively, as described above with respect to FIG. 5.

While some example embodiments have been particularly shown and described, it will be understood by one of ordinary skill in the art that variations in form and detail may be made therein without departing from the spirit and scope of the claims.

What is claimed is:

1. A graphene switching device having a tunable barrier, comprising:
 a semiconductor layer configured to form an energy gap between a graphene layer and a first electrode,
  the first electrode being on a first region of the semiconductor layer,
  the graphene layer being on the semiconductor layer, the graphene layer having a zero band gap;
 an insulating layer on a second region of the semiconductor layer,
  the insulating layer being separated from the first electrode,
  the graphene layer being between the first electrode and the insulating layer,
  the graphene layer extending onto the insulating layer;
 a second electrode on the graphene layer and the second region of the semiconductor layer,
  the second electrode facing the insulating layer;
 a gate dielectric on the graphene layer; and
 a gate electrode on the gate dielectric.

2. The graphene switching device of claim 1, wherein the semiconductor layer includes one of silicon, germanium, silicon-germanium, a group III-V semiconductor, and a group II-VI semiconductor.

3. The graphene switching device of claim 1, wherein the graphene layer is separated from the first electrode.

4. The graphene switching device of claim 1, wherein a gap between the graphene layer and the first electrode is about 1 nm to about 30 nm.

5. The graphene switching device of claim 1, wherein the first and second electrodes contain one of metal and polysilicon.

6. The graphene switching device of claim 1, wherein the graphene switching device is a uni-polar transistor having a polarity that is the same as an impurity type of the semiconductor layer.

7. The graphene switching device of claim 6, wherein the energy gap formed by the semiconductor layer changes according to a gate voltage applied to the gate electrode.

8. The graphene switching device of claim 1, wherein at least a portion of the graphene layer has one to four layers of graphene.

9. A graphene switching device having a tunable barrier, comprising:
   a graphene layer including a first surface opposite a second surface;
   a semiconductor layer containing one of an n-type impurity and a p-type impurity,
      the semiconductor layer contacting one of a first part of the first surface of the graphene layer and a first part of the second surface of the graphene layer, the graphene layer having a zero band gap;
   a first electrode contacting the semiconductor layer,
      the first electrode being separated from the graphene layer,
   a second electrode contacting a second part of the first surface of the graphene layer;
   a gate electrode; and
   a gate dielectric contacting the gate electrode and the graphene layer,
      the gate dielectric being between the gate electrode and the semiconductor layer.

10. The graphene switching device of claim 9, wherein the semiconductor layer includes one of silicon, germanium, silicon-germanium, a group III-V semiconductor, and a group II-VI semiconductor.

11. The graphene switching device of claim 9, wherein at least one of the first and second electrodes contains one of metal and polysilicon.

12. The graphene switching device of claim 9, wherein at least a portion of the graphene layer has a thickness of one to four layers of graphene.

13. The graphene switching device of claim 9, wherein the graphene switching device is a uni-polar transistor having a polarity that is the same as an impurity type of the semiconductor layer.

14. The graphene switching device of claim 13, wherein
   the semiconductor layer is configured to form an energy gap between the graphene layer and the first electrode, and
   the energy gap changes according to a gate voltage applied to the gate electrode.

15. The graphene switching device of claim 9, wherein
   the semiconductor layer contacts the first part of the second surface of the graphene layer,
   the graphene layer is on the semiconductor layer,
   the first electrode is on the semiconductor layer,
   the gate dielectric is on the graphene layer, and
   the gate electrode is on the gate dielectric.

16. The graphene switching device of claim 15, wherein a gap of about 1 nm to about 30 nm separates the first electrode and the graphene layer along a surface of the semiconductor layer.

17. The graphene switching device of claim 16, wherein the gate dielectric fills the gap separating the first electrode and the graphene layer.

18. The graphene switching device of claim 15, further comprising:
   an insulating layer between a second part of the second surface of the graphene layer and the semiconductor layer, wherein
   the graphene layer extends between the insulating layer and the second electrode.

19. The graphene switching device of claim 9, wherein the graphene layer is configured to function as a pathway for one of electrons and holes flowing through the graphene layer when a gate voltage is applied to the gate electrode.

20. The graphene switching device of claim 1, wherein the first and second electrodes are on a same contiguous portion of the semiconductor layer.

21. The graphene switching device of claim 1, wherein a bottommost surface of the graphene layer, a bottommost surface of the first electrode, and a bottommost surface of the insulating layer are on an upper surface of the semiconductor layer.

22. The graphene switching device of claim 9, further comprising:
   an insulating layer below the second electrode and the graphene layer,
   wherein a bottommost surface of the graphene layer, a bottommost surface of the first electrode, and a bottommost surface of the insulating layer are on an upper surface of the semiconductor layer.

23. The graphene switching device of claim 18, wherein the graphene layer extends horizontally between a sidewall of the first electrode and a sidewall of the insulating layer.

* * * * *